US008958907B2

(12) United States Patent
Saeki et al.

(10) Patent No.: US 8,958,907 B2
(45) Date of Patent: Feb. 17, 2015

(54) ROBOT ARM APPARATUS

(75) Inventors: Toru Saeki, Minato-ku (JP); Yasumichi Mieno, Minato-ku (JP); Yuji Urabe, Minato-ku (JP); Toshio Kamigaki, Minato-ku (JP); Yoji Masui, Minato-ku (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 280 days.

(21) Appl. No.: 13/426,050

(22) Filed: Mar. 21, 2012

(65) Prior Publication Data

US 2012/0253511 A1 Oct. 4, 2012

(30) Foreign Application Priority Data

Mar. 31, 2011 (JP) ................................. 2011-077268
Oct. 25, 2011 (JP) ................................. 2011-233562

(51) Int. Cl.
*G06F 19/00* (2011.01)
*H01L 21/68* (2006.01)
(Continued)

(52) U.S. Cl.
CPC ........ *H01L 21/681* (2013.01); *H01L 21/67742* (2013.01); *H01L 21/68707* (2013.01); *Y10S 414/135* (2013.01); *Y10S 414/137* (2013.01); *Y10S 414/141* (2013.01)
USPC ...... 700/245; 700/258; 318/567; 318/568.11; 318/568.2; 318/568.21; 318/574; 414/744.1; 414/744.5; 414/935; 414/937; 414/941

(58) Field of Classification Search
USPC ......... 700/245, 246, 247, 249, 250, 252, 253, 700/254, 257, 258, 259, 260, 261, 262, 700/264; 318/567, 568.11, 568.2, 568.21, 318/574; 901/1, 2, 3, 6, 8, 15, 23; 414/1, 414/403, 744.1, 744.5, 935, 936, 937, 940, 414/941
See application file for complete search history.

(56) References Cited

U.S. PATENT DOCUMENTS 4,819,167 A * 4/1989 Cheng et al. .................... 700/59
5,004,399 A * 4/1991 Sullivan et al. ............... 414/729
(Continued)

FOREIGN PATENT DOCUMENTS

JP 08-222611 8/1996
JP 2002-270674 9/2002
(Continued)

OTHER PUBLICATIONS

Japanese Office Action issued in JP 2011-077268 on Nov. 25, 2014.

*Primary Examiner* — Khoi Tran
*Assistant Examiner* — Jaime Figueroa
(74) *Attorney, Agent, or Firm* — Oblon, Spivak, McClelland, Maier & Neustadt, L.L.P.

(57) ABSTRACT

A robot arm apparatus includes an arm mechanism including a base member and a link pivotally connected to the base member for pivotal motion in a horizontal plane through a rotational shaft. The link holds a regular circular transport object at its distal end. The apparatus also includes an edge detector, provided on the base member, that detects two edges of the regular circular transport object as the link pivotally rotates with respect to the base member, a pivotal angle detector that detects a pivotal angle of the link with respect to the base member, and a center position calculator that calculates a center position of the regular circular transport object with respect to the link. The calculation is based on two pivotal angles detected by the pivotal angle detector when the edge detector detects the two edges of the regular circular transport object.

11 Claims, 12 Drawing Sheets

(51) Int. Cl.
*H01L 21/677* (2006.01)
*H01L 21/687* (2006.01)

(56) References Cited

U.S. PATENT DOCUMENTS

| | | | | |
|---|---|---|---|---|
| 5,135,349 | A * | 8/1992 | Lorenz et al. | 414/744.6 |
| 5,452,078 | A * | 9/1995 | Cheng | 356/150 |
| 5,789,890 | A * | 8/1998 | Genov et al. | 318/567 |
| 5,813,819 | A * | 9/1998 | Ohsawa et al. | 414/416.08 |
| 6,037,733 | A * | 3/2000 | Genov et al. | 318/568.11 |
| 6,813,543 | B2 * | 11/2004 | Aalund et al. | 700/245 |
| 6,893,204 | B1 * | 5/2005 | Suzuki et al. | 414/744.5 |
| 7,008,884 | B2 * | 3/2006 | Wakizako et al. | 438/782 |
| 7,179,044 | B2 * | 2/2007 | Cameron et al. | 414/811 |
| 7,244,088 | B2 * | 7/2007 | Lero et al. | 414/416.08 |
| 8,220,354 | B2 * | 7/2012 | Todorov | 74/490.05 |
| 8,395,136 | B2 * | 3/2013 | Kondoh | 250/559.33 |
| 2005/0063797 | A1 * | 3/2005 | Lero et al. | 414/217 |
| 2006/0020367 | A1 * | 1/2006 | Nangoy | 700/245 |
| 2006/0045719 | A1 * | 3/2006 | Bacchi et al. | 414/744.5 |
| 2007/0071581 | A1 * | 3/2007 | Gilchrist et al. | 414/217 |
| 2010/0161124 | A1 * | 6/2010 | Kimura | 700/251 |
| 2010/0172720 | A1 * | 7/2010 | Kondoh | 414/217 |
| 2010/0319209 | A1 | 12/2010 | Nakamura et al. | |
| 2012/0101633 | A1 * | 4/2012 | Rodnick | 700/253 |

FOREIGN PATENT DOCUMENTS

| | | |
|---|---|---|
| JP | 2007-149960 | 6/2007 |
| JP | 2011-3837 | 1/2011 |
| WO | WO 2005/004227 A1 | 1/2005 |

* cited by examiner

ROBOT ARM APPARATUS

CROSS REFERENCE TO RELATED APPLICATION

This application claims priority to Japanese Application Number 2011-077268, filed on Mar. 31, 2011, and Japanese Application Number 2011-233562, filed on Oct. 25, 2011, the entire contents of which are hereby incorporated by reference.

BACKGROUND OF THE INVENTION

1. Field of the Invention

This invention relates to a robot arm type transport apparatus configured from a plurality of links connected for pivotal motion to each other, and more particularly to a robot arm type transport apparatus which has a function of detecting a held state of a transport object article. The present invention relates also to an arm type transport apparatus having a link mounted for pivotal motion, and more particularly to an arm type transport apparatus having a function of detecting the center position of a regular circular transport object article such as a wafer and correcting the positional displacement of the transport object article.

2. Description of the Related Art

Transport apparatus are known which transport a thin transport object article of a disk shape or regular circular shape such as a semiconductor wafer in accordance with a fabrication process. One of such transport apparatus is a robot arm type or arm type transport apparatus which is configured from a plurality of links connected in series for pivotal motion relative to each other through revolute joint sections, which are individually driven to rotate to take out transport object articles one by one from an accommodating case, in which the transport object articles are accommodated at a predetermined pitch, and transport the taken out transport object article.

In a robot arm of the robot arm type transport apparatus, a holding element for holding a transport object article is provided at an end effecter which is a first link at a distal end of the robot arm. As means for holding a transport object article, various means are available including means for holding by vacuum attraction, means for sandwiching using a mechanical chuck and means for merely receiving a transport object article. However, whichever means is used, it is necessary to detect whether or not the end effecter appropriately holds a transport object article.

As one of means for such detection, it is disclosed in Japanese Patent Laid-Open No. 2002-270674 to provide a sensor for detecting presence or absence of a transport object article such as a photo-sensor or an electrostatic sensor on the end effecter.

Meanwhile, in a general transport system, when a regular circular transport object article is transported to a processing apparatus, in order to correct displacement of the position of the regular circular transport object article and appropriately transport the regular circular transport object article, alignment is carried out using an apparatus called aligner. The direction upon alignment includes three-directions including X and Y directions and a θ direction which is the direction of an axis of rotation of the aligner.

Japanese Patent Laid-Open No. Hei 8-222611 discloses, as a method for aligning a regular circular transport object article, a method of detecting displacement of the regular circular transport object article in X, Y and θ directions to carry out alignment.

SUMMARY OF THE INVENTION

However, for such a robot arm type transport apparatus as described above, it is demanded to minimize the end effecter so that it can move into and out of a small space such as a space in the inside of an accommodating case in which wafers are accommodated at a small accommodation pitch. However, in the configuration wherein a sensor is provided on the end effecter itself as described above, the space for attaching the sensor is required for the end effecter, and this increases the size of the end effecter itself. Besides, for example, in the case where the end effecter is moved into and out of a high temperature region or a low temperature region in the inside of a processing apparatus, the sensor moves into and out of the high temperature region or the low temperature region together with the end effecter and therefore may possibly be damaged.

On the other hand, as one of means for avoiding such a failure as described above, it seems a possible idea to attach a sensor for detecting presence or absence of a transport object article on the end effecter to a different apparatus than the robot arm type transport apparatus. However, this requires assurance of a place to which the sensor is attached and transportation of a transport object article to a predetermined detection position of the sensor provided on the different apparatus every time detection is to be carried out. Thus, the transport efficiency is deteriorated.

Meanwhile, according to the method disclosed in Japanese Patent Laid-Open No. Hei 8-222611 mentioned hereinabove, while a regular circular transport object article is being transported, the position of the center of the regular circular transport object article can be detected only on the aligner installed at a place different from the arm type carrying apparatus. Consequently, when a regular circular transport object article is to be transported, it is transported once to and aligned by the aligner, and then it is taken out from the aligner and transported to an object place. Therefore, the method has a problem in that additional time is required for the transportation to the aligner and the adjustment by the aligner.

Further, general aligners including an aligner disclosed in Japanese Patent Laid-Open No. Hei 8-222611 detect a positional displacement amount in each of different directions and correct the displacement amounts detected on driving shafts individually provided for the X, Y and rotational directions. Therefore, the general aligners have a problem that three driving shafts must be provided for one aligner and the cost increases as much.

It is an object of the present invention to provide a robot arm type transport apparatus which can appropriately detect a held state of a transport object article without involving increase in size of an end effecter for holding a transport object article, damage to a sensor and deterioration of the transport efficiency.

It is another object of the present invention to provide an arm type transport apparatus which can detect a center position of a regular circular transport object article in short time and can decide positional displacement of a regular circular transport object article based on the detected center position of the regular circular transport object article.

In order to attain the objects described above, according to an aspect of the present invention, there is provided a robot arm type transport apparatus including an arm mechanism configured from a plurality of links connected for pivotal motion relative to each other in a horizontal plane through a revolute joint section or sections and including a first link for holding a transport object article thereon, and a sensor attached to that of the links which is on a proximal end side with respect to the first link from among the plural links which configure the arm mechanism for detecting that the transport object article is positioned at a detection position defined in accordance with the attached position of the sensor, the attached position of the sensor being set such that, when the revolute joint section is driven to rotate in a direction in which the first link approaches the link to which the sensor is attached, the transport object article held regularly by the first link passes the detection position so that the transport object article can be detected by the sensor.

In the robot arm type transport apparatus, the attached position of the sensor is set such that, only by driving the revolute joint section to rotate in the direction in which the first link approaches the link to which the sensor is attached, the transport object article held regularly on the first link can pass and be detected at the detection position. Therefore, it can be detected whether or not the first link holds a transport object article thereon, and the necessity to transport a transport object article to a predetermined detection position provided in a different apparatus than the transport apparatus in order to detect whether or not a transport object article is present is eliminated. Therefore, the transport efficiency can be improved. Besides, since the sensor is attached to the link on the proximal end side with respect to the first link for holding a transport object article, the first link can be formed in a reduced thickness in comparison with that in an alternative case in which the sensor is attached to the first link, that is, an end effecter, as in the case of the conventional apparatus. Therefore, the robot arm type transport apparatus can satisfy also a request, for example, to move the first link into and out of a small space such as the inside of an accommodation case in which transport object articles are accommodated at a small accommodation pitch. Further, since the sensor is attached to the link on the proximal end side with respect to the first link for holding a transport object article, even where the first link moves into and out of, for example, a high temperature region or a low temperature region in the inside of a processing apparatus, it is possible to avoid the sensor from moving into and out of the high temperature region or the low temperature region together with the first link thereby to avoid otherwise possible damage to the sensor.

In order to detect not only whether or not a transport object article W is held but also whether or not a transport object article W is held in a positionally displaced state from a predetermined position, preferably the robot arm type transport apparatus further includes a decision section configured to measure, when the transport object article is moved at a predetermined speed, time required for a portion of the transport object article from one end portion to the other end portion to pass the detection position and decide whether or not the transport object article is in a positionally displaced state from the predetermined position in accordance with an error between the measured time and predetermined time required when the transport object article is held at the predetermined position on the first link.

Since the robot arm type transport apparatus is configured in such a manner as described above, it can be detected whether or not a transport object article is held only by driving the revolute joint section to rotate in the direction in which the first link approaches the link to which the sensor is attached. Consequently, the transport efficiency can be improved with unnecessary operation reduced to the utmost. Besides, since the sensor is attached to the link on the proximal end side with respect to the first link for holding a transport object article, the installation space for the sensor can be eliminated to miniaturize the first link and the sensor can be avoided from moving into and out of a high or low temperature region together with the first link. Consequently, otherwise possible damage to the sensor can be avoided. Accordingly, the robot arm type transport apparatus can detect a held state of a transport object article appropriately without suffering from such failures as described above.

According to another aspect of the present invention, there is provided an arm type transport apparatus including an arm mechanism including a link attached to a base member for holding a regular circular transport object article for pivotal motion in a horizontal plane through a rotational shaft, an edge detection section attached to the base member together with the rotational shaft and adapted to detect that an edge of the regular circular transport object article is positioned at a detection position determined with respect to the attached position thereof, a pivotal angle detection section adapted to detect a pivotal angle of the link with respect to the base member, and a center position calculation section adapted to calculate a center position of the regular circular transport object article with respect to the link based on the corresponding pivotal angle detected by the pivotal angle detection section when the edge of the regular circular transport object article passes the edge detection section.

In the arm type transport apparatus, only by moving the link, which holds a regular circular transport object article thereon, to pass the edge detection section of the base member, the center position coordinate of the regular circular transport object article can be calculated by the rotational angle detection section and the center position calculation section without the necessity to transport such transport object articles one by one to an aligner or the like installed separately from the arm type transport apparatus so that the transport object article is aligned by the aligner. Therefore, the time required for transportation and alignment can be reduced significantly and also the cost can be reduced significantly.

In order to decide positional displacement of a regular circular transport object article from a position at which it should originally be positioned, preferably the arm type transport apparatus further includes a center position displacement decision section adapted to detect positional displacement of the regular circular transport object article based on the center position calculated by the center position calculation section, the center position displacement decision section deciding center position displacement from a reference center position applied in advance to an actual center position when the calculation by the center position calculation section is carried out with regard to the regular circular transport object article placed on the link to be measured based on the reference center position and the actual center position.

With the arm type transport apparatus described above, by moving a regular circular transport object article to pass the edge detection section provided on the proximal end portion side of the link, the center position coordinate of the regular circular transport object article can be calculated without the necessity to transport such transport object articles one by one to the aligner or the like to carry out alignment of the regular circular transport object article. Therefore, the time required for transportation and alignment can be reduced significantly and also the cost can be reduced significantly.

The above and other objects, features and advantages of the present invention will become apparent from the following description and the appended claims, taken in conjunction with the accompanying drawings in which like parts or elements denoted by like reference characters.

DETAILED DESCRIPTION OF THE PREFERRED EMBODIMENT

Figure 1A:
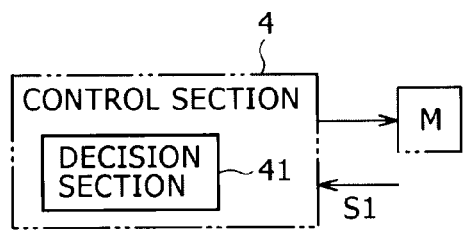
FIG. 1A is a block diagram showing a control section of a robot arm type transport apparatus according to a first embodiment of the present invention.
Figure 1B:
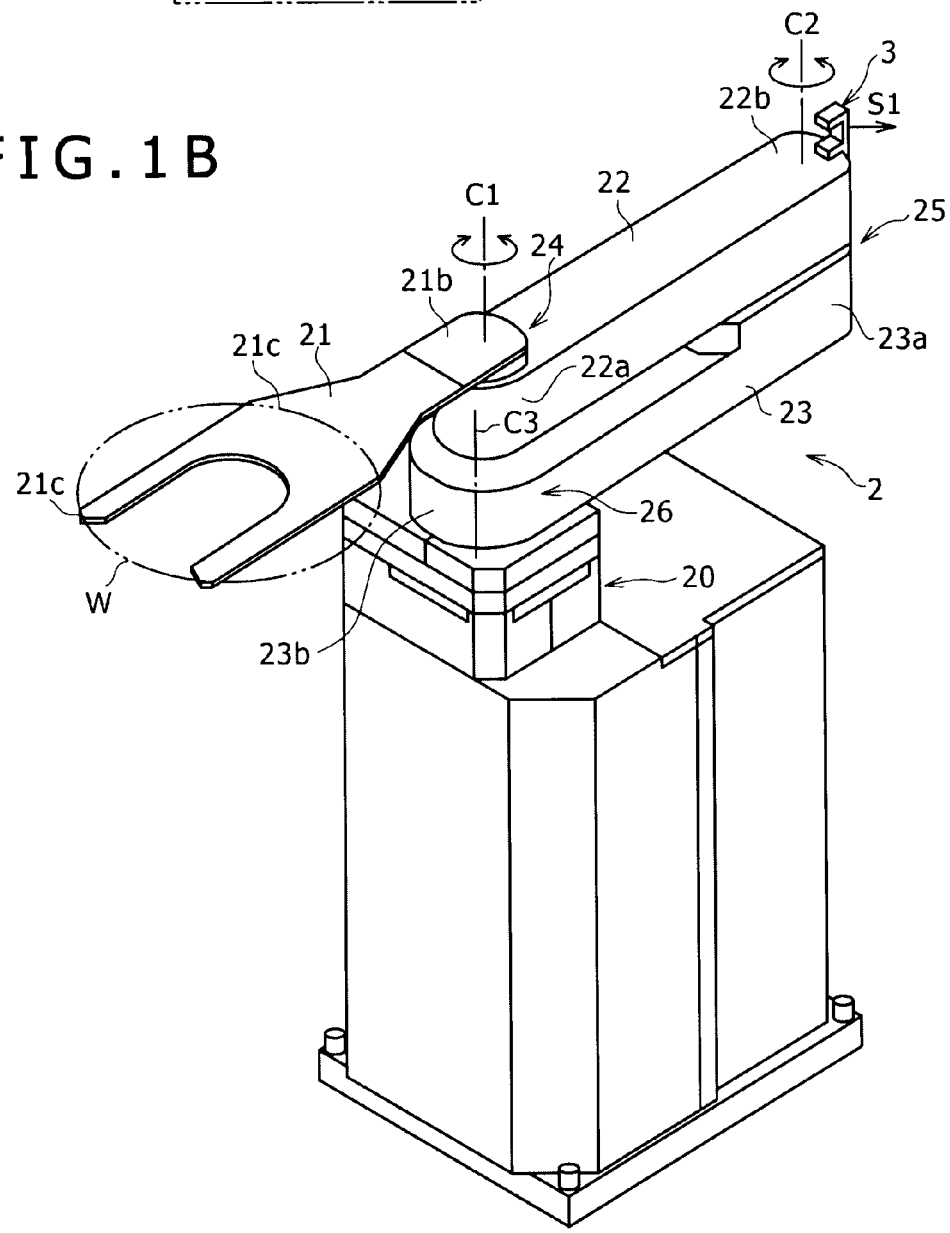
FIG. 1B is a perspective view showing the robot arm type transport apparatus.

In the following, a robot arm type transport apparatus according to a first embodiment of the present invention is described with reference to FIGS. 1A to 5B.

Referring first to FIGS. 1A, 1B, 4A and 4B, the robot arm type transport apparatus includes an arm mechanism 2 configured from a plurality of links 21, 22 and 23 connected for pivotal motion relative to each other within a horizontal plane through revolute joint sections 24, 25 and 26, respectively. Of the links 21, 22 and 23, the first link 21 is called also end effecter and adapted to hold a transport object article W such as a semiconductor wafer in the form of a disk thereon. The robot arm type transport apparatus further includes a sensor 3 held on the first link 21 for detecting a transport object article W, and a control section 4 for controlling pivotal driving of the revolute joint sections 24, 25 and 26 of the arm mechanism 2 to transport a transport object article W held by the first link 21 to a desired position.

Figure 4A:
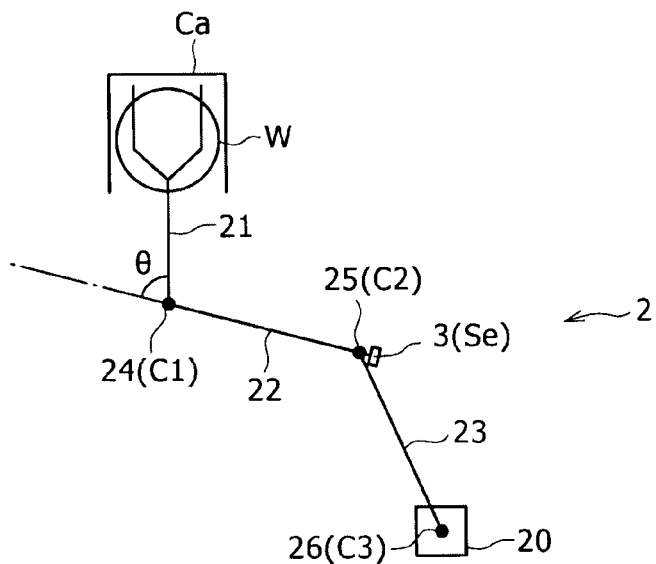
FIGS. 4A and 4B are plan views schematically illustrating a movement of the robot arm.
Figure 4B:
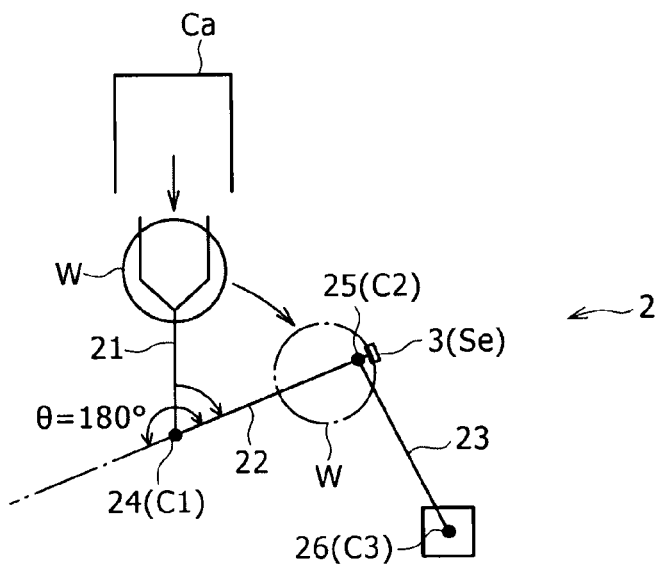

The arm mechanism 2 particularly includes a first link 21 for holding a transport object article W on the distal end side thereof, a second link 22 connected at a distal end portion 22a thereof to a proximal end portion 21b of the first link 21 for pivotal motion in a horizontal plane, a third link 23 connected at a distal end portion 23a thereof to a proximal end portion 22b of the second link 22 for pivotal motion within a horizontal plane, and a base 20 for supporting a proximal end portion 23b of the third link 23 for pivotal motion in a horizontal plane. The first link 21 has a form of a plate having a substantially Y shape in plan and has an offset portion 21c formed on an upper face thereof. The offset portion 21c has a shape corresponding to a peripheral edge of the transport object article W in the form of a disk. The offset portion 21c is a receiving face on which the transport object article W is to be placed and is formed lower at the inner periphery side thereof than at the outer periphery side thereof so as to exhibit a function of holding the transport object article W. The proximal end portion 21b of the first link 21 and the distal end portion 22a of the second link 22 are connected to each other for pivotal motion in a horizontal plane around an axis C1 of a rotational shaft extending along a perpendicular direction to the proximal end portion 21b and the distal end portion 22a to configure the first revolute joint section 24. Similarly, the proximal end portion 22b of the second link 22 and the distal end portion 23a of the third link 23, and the proximal end portion 23b of the third link 23 and the base 20, are connected for pivotal motion within horizontal planes around rotational axes C2 and C3 extending along a perpendicular direction to the proximal end portion 22b and the distal end portion 23a and to the proximal end portion 23b and the base 20 to configure the second revolute joint section 25 and the third revolute joint section 26, respectively. The revolute joint sections 24, 25 and 26 are configured to drive the links 21, 22 and 23 independently of each other by means of a power section M for which a motor or the like is used so that the angle θ between the links 21 and 22 can be changed as seen in FIGS. 4A and 4B.

Figure 2:
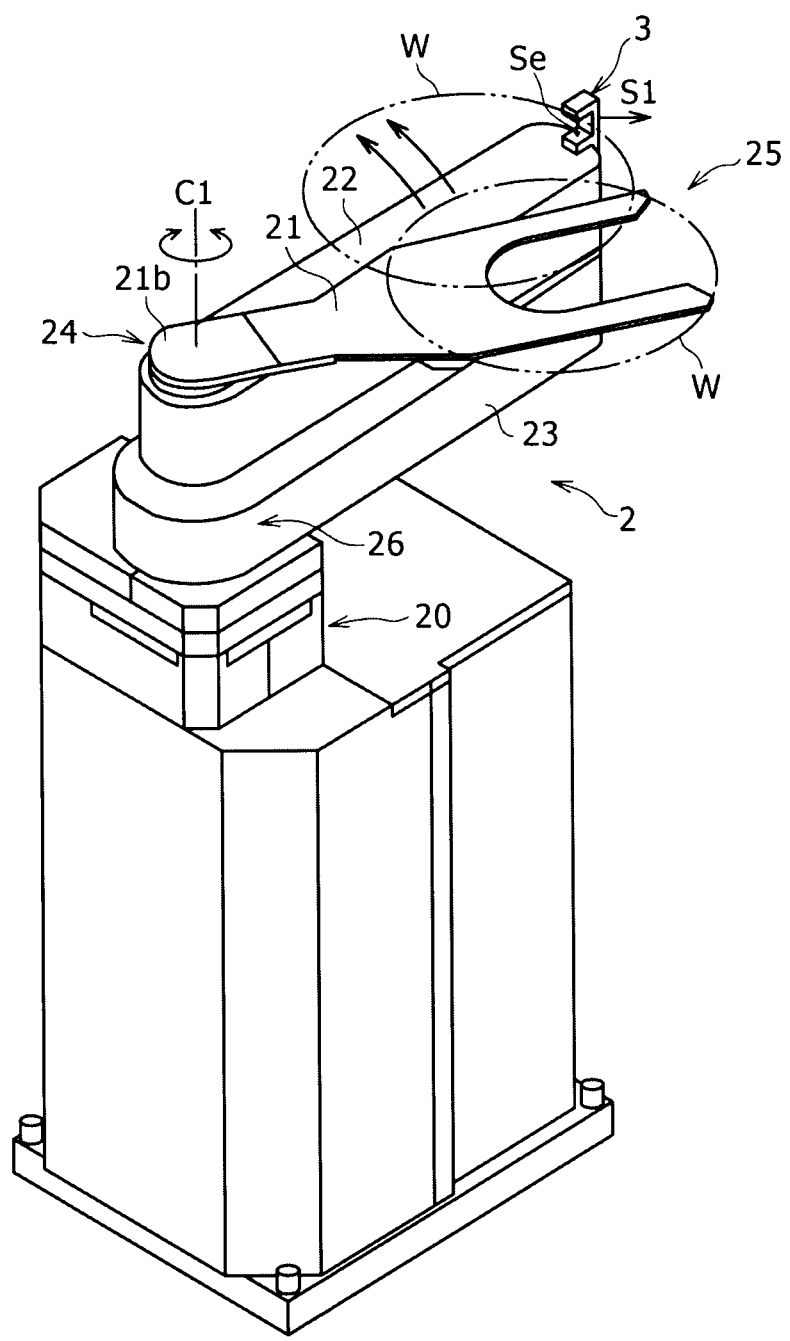
FIG. 2 is a perspective view illustrating a movement of a robot arm of the robot arm type transport apparatus.
Figure 3:
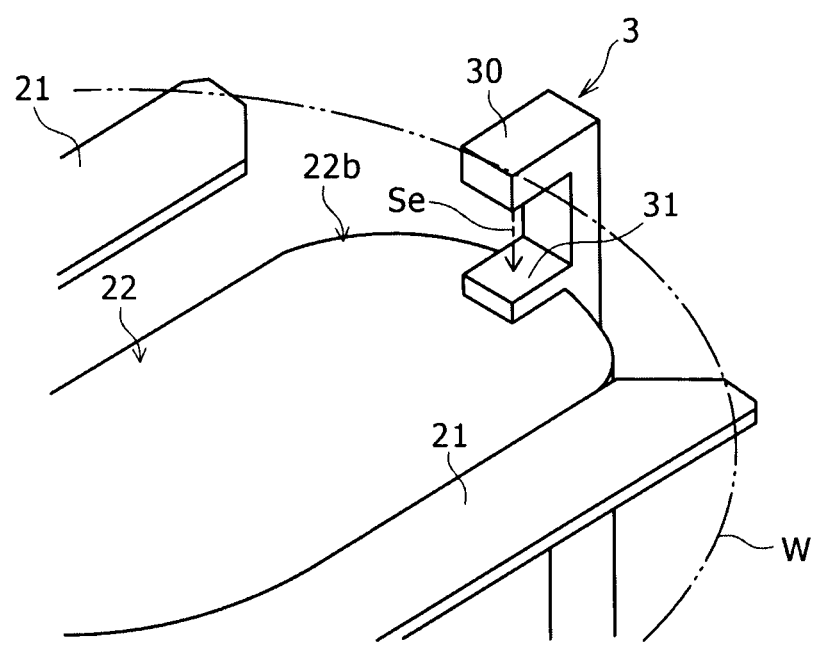
FIG. 3 is an enlarged perspective view showing a sensor section of the robot arm.

Referring to FIG. 3, the sensor 3 for detecting a transport object article W detects that a transport object article W is positioned at a detection position Se corresponding to the attached position thereof like a photoelectric sensor formed from a light emitting element 30 and a light receiving element 31 or the like. In particular, the sensor 3 detects a transport object article W depending upon whether or not a light beam which advances from the sensor 3 toward the light receiving element 31 is intercepted by a transport object article W which passes the detection position Se on a path of light which interconnects the light emitting element 30 and the light receiving element 31. As seen in FIGS. 1B to 4B, the sensor 3 is attached at such a position at the proximal end portion 22b of the second link 22, which is positioned on the proximal end side with respect to the first link 21 from among the links 21, 22 and 23 which configure the arm mechanism 2, that, when the first revolute joint section 24 is driven to rotate in a direction in which the first link 21 approaches the second link 22 to which the sensor 3 is attached, the transport object article W held regularly by the first link 21 can pass the detection position Se and be detected by the sensor 3. Further, the attached position of the sensor 3 is set such that, when the revolute joint sections 24, 25 and 26 are driven to pivot, the sensor 3 does not interfere with the links 21, 22 and 23. In other words, it is considered that the sensor 3 is attached to a position keeping away from the loci of the pivotal motion of the links 21, 22 and 23.

The control section 4 shown in FIG. 1A is configured from a popular microcomputer unit including a CPU, a memory and an interface all not shown. Required programs for a transport controlling routine and so forth are written in the memory, and the CPU reads out and executes a necessary program suitably to implement a decision section 41 which decides a desired transport operation or a held state of a transport object article W in cooperation with peripheral hard resources.

A held state checking process using the sensor described above is executed by the decision section 41. In particular, if a movement of inserting only the first link 21 into a accommodating case Ca such as a FOUP (Front Open Unified Pod) of a transport source as seen in FIG. 4A, holding a transport object article W such as a semiconductor wafer by means of the first link 21 and taking out the transport object article W from the accommodating case Ca, then, as seen in FIGS. 2 and 4B, the first revolute joint section 24 is driven to rotate in a direction in which the first link 21 approaches the second link 22 to which the sensor 3 is attached to move the transport object article W, which may possibly be held by the first link 21, so that the transport object article W passes the detection position Se. In this instance, the held state of the transport object article W is decided in accordance with a result of the detection of the sensor 3 when the angle θ of the first link 21 with respect to the second link 22 is a predetermined angle at which the transport object article W may possibly be positioned at the detection position Se and which may be, for example, 180 degrees as seen in FIG. 4B. In particular, if an interception state is detected by the sensor 3, then the decision section 41 decides that a transport object article W is held, and then advances to a next transport operation. However, if a non-interception state is detected by the sensor 3, then the decision section 41 decides that no transport object article W is held, and then advances to an error process.

As described above, the robot arm type transport apparatus according to the present embodiment includes an arm mechanism 2 configured from a plurality of links 21, 22 and 23, which include a first link 21 for holding a transport object article W, connected for pivotal motion within horizontal planes through revolute joint sections 24, 25 and 26, respectively, and a sensor 3 attached to the second link 22 provided on the proximal end side with respect to the first link 21 from among the links 21, 22 and 23 which configure the arm mechanism 2 for detecting that a transport object article W is positioned at a detection position Se defined corresponding to the attached position of the sensor 3, the attached position of the sensor 3 being set such that, when the revolute joint section 24 is driven to rotate in a direction in which the first link 21 approaches the second link 22 to which the sensor 3 is attached, the transport object article W held regularly by the first link 21 can pass the detection position Se so that the transport object article W can be detected by the sensor 3.

In this manner, since the attached position of the sensor 3 is set such that, when the revolute joint section 24 is driven to rotate in a direction in which the first link 21 approaches the second link 22 to which the sensor 3 is attached, the transport object article W held regularly by the first link 21 can pass the detection position Se so that the transport object article W can be detected by the sensor 3, it can be detected whether or not the first link 21 holds the transport object article W thereon. Consequently, the necessity to transport a transport object article to a predetermined detection position provided on a different apparatus other than the transport apparatus in order to detect presence or absence of a transport object article is eliminated, and the transport efficiency can be enhanced. Besides, since the sensor 3 is attached to the link 22 on the proximal end side with respect to the first link 21 for holding the arm mechanism 2, reduction in thickness of the first link or end effecter can be achieved in comparison with the conventional arrangement wherein the sensor 3 is attached to the link 22 on the proximal end side with respect to the first link 21 for holding the transport object article W. For example, the robot arm type transport apparatus of the present embodiment can satisfy the request to move the first link into and out of a small space like the inside of an accommodation case which has a small accommodation pitch. Further, since the sensor 3 is attached to the link 22 on the proximal end side with respect to the first link 21 for holding the transport object article W, for example, even where the first link moves into and out of a high temperature region or a low temperature region in the inside of a processing apparatus, it is possible to avoid the sensor from moving into and out of the high temperature region or the low temperature region together with the first link. Consequently, damage to the sensor can be avoided.

Although the robot arm type transport apparatus according to the embodiment of the present invention is described above, it can be modified in various manners.

For example, while, in the present embodiment, the sensor 3 is attached to the second link 22, the link to which the sensor 3 is attached is not limited to the second link 22, but the sensor 3 may be applied to any link only if the link is provided on the proximal end side with respect to the first link 21 and may be applied, for example, to the third link 23. While the arm mechanism in the present embodiment is configured from the three links 21 to 23 connected to each other for pivotal motion in horizontal planes, it may otherwise be configured from two or four or more links connected to each other similarly.

Figure 5A:
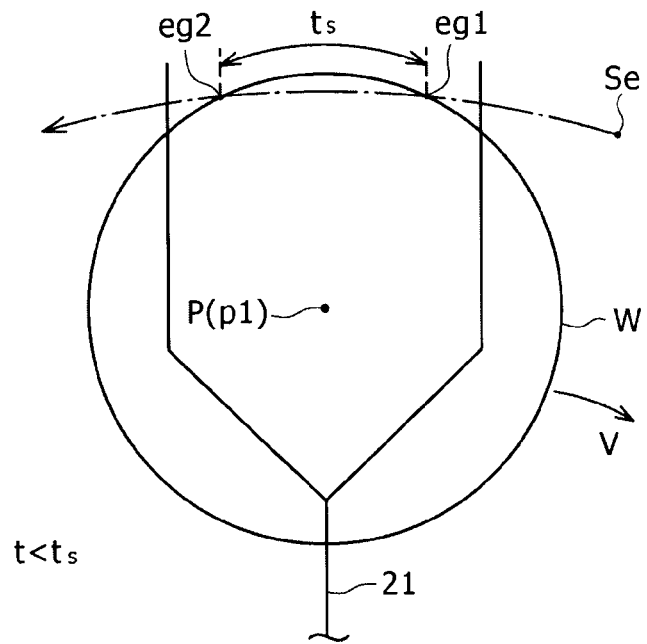
FIGS. 5A and 5B are schematic views illustrating a state in which a transport object article is held at a predetermined position and another state in which the transport object article is held but displaced from the predetermined position, respectively.
Figure 5B:
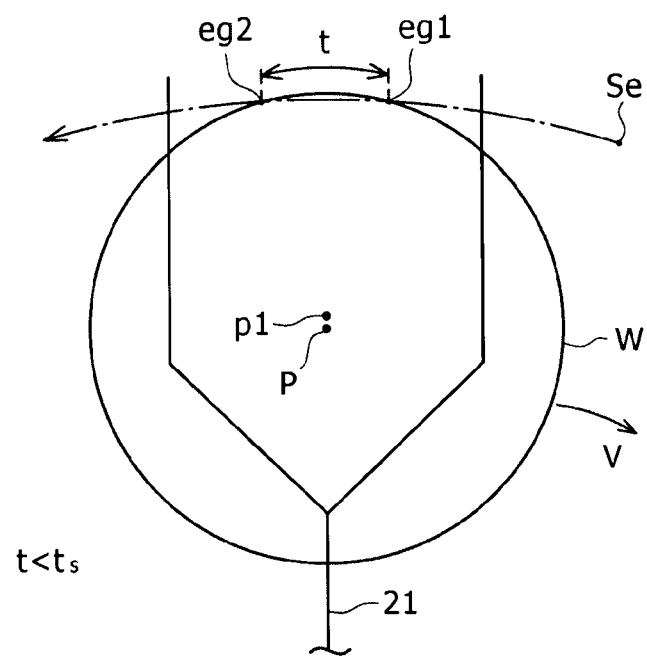

Further, while, in the present embodiment, the control section 4 is configured such that it detects whether or not a transport object article W is held by the first link 21, it may otherwise be configured such that, for example, as shown in FIGS. 5A and 5B, it decides whether or not a transport object article W is held in a state displaced from a normal predetermined position P1 on the first link 21. In particular, the decision section 41 measures time t required for a portion of the transport object article W from a one end eg1 to the other end eg2 to pass the detection position Se when the transport object article W is moved at a predetermined speed such as a speed V and decides whether or not the transport object article W suffers from positional displacement from the predetermined position P1 in accordance with an error between the measure time t and predetermined time $t_s$ when the transport object article W is held at the predetermined position P1 on the first link 21, that is, in accordance with $|t-t_s|$. More particularly, the decision section 41 sets in advance the predetermined time $t_s$ required for the portion of the transport object article W from the one end eg1 to the other end eg2 to pass the detection position Se when the center P of the transport object article W coincides with the predetermined position P1, that is, when the transport object article W is held at the predetermined position P1. Then, if the error $|t-t_s|$ between the measured time and the predetermined time $t_s$ is within the predetermined range, that is, if $|t-t_s| \leq th$, which is a predetermined threshold value, then the decision section 41 decides that the transport object article W is held at the predetermined position P1. On the other hand, if the error $|t-t_s|$ is not within the predetermined range, that is, if $|t-t_s| > th$, then the decision section 41 decides that the transport object article W is held in a positionally displaced state from the predetermined position P1. If the robot arm type transport apparatus is configured in this manner, then only by driving the first revolute joint section 24 to rotate so that the transport object article W passes the detection position Se at the predetermined speed, it can be detected not only whether or not a transport object article W is held by the first link 21 but also whether or not the transport object article W is held in a positionally displaced relationship from the predetermined position P1 on the first link 21. It is to be noted that, if the wafer as the transport object article W has a notch on a circumferential edge portion thereof, then the wafer may be moved such that a portion thereof other than the notch may pass the detection position Se.

Further, while a photo-sensor of the transmission type is used as the sensor, a photo-sensor of the reflection type may be used instead.

Further, while the trajectory correction described above in the present embodiment is applied to a transport apparatus which includes an arm mechanism configured from a plurality of links connected in series for pivotal motion relative to each other, it can be applied also to a transport apparatus which includes an arm mechanism of any other type. For example, it is possible to apply the trajectory correction also to a transport apparatus such as a parallel manipulator configured from a plurality of links connected in parallel to each other.

Further, while the robot arm type transport apparatus of the present embodiment is configured such that a transport object article W such as a wafer is held by the first link or end effecter by placing the transport object article W on the first link or end effecter, it may otherwise be configured such that a transport object article W is held by vacuum attraction or mechanical chucking.

Now, an arm type transport apparatus according to a second embodiment of the present invention is described with reference to FIGS. 6A to 12. The arm type transport apparatus has a basically similar configuration to that of the robot arm type transport apparatus according to the first embodiment of the present invention described above.

Referring first to FIGS. 6A, 6B, 9A and 9B, the arm type transport apparatus is of the robot arm type and includes an arm mechanism 102 configured from a plurality of links 121, 122 and 123 connected for pivotal motion relative to each other within a horizontal plane through revolute joint sections 124, 125 and 126, respectively. Of the links 121, 122 and 123, the first link 121 is called also end effecter and adapted to hold a regular circular transport object article W such as a semiconductor wafer in the form of a disk thereon. The robot arm type transport apparatus further includes an edge detection section 103 held on the first link 121 for detecting an edge of a regular circular transport object article W, and a control section 104 for controlling pivotal driving of the revolute joint sections 124, 125 and 126 of the arm mechanism 102 to transport a regular circular transport object article W held by the first link 121 to a desired position.

Figure 9A:
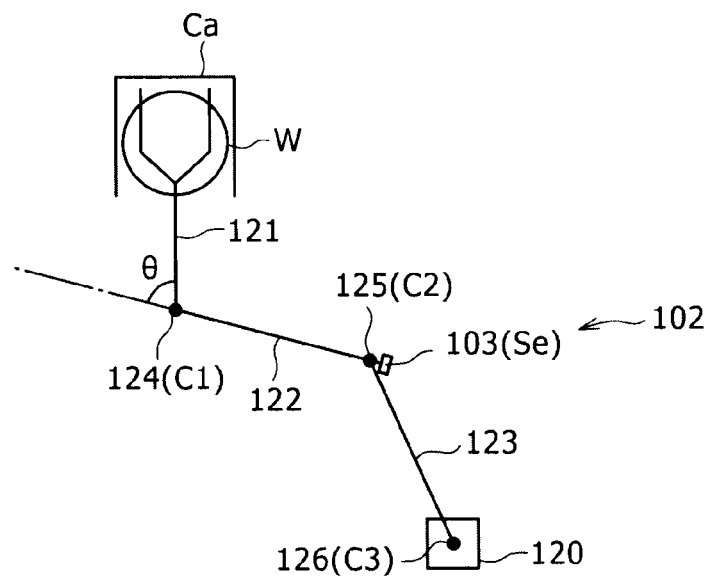
FIGS. 9A and 9B are plan views schematically illustrating a movement of the arm of the arm type transport apparatus of FIG. 6B.
Figure 9B:
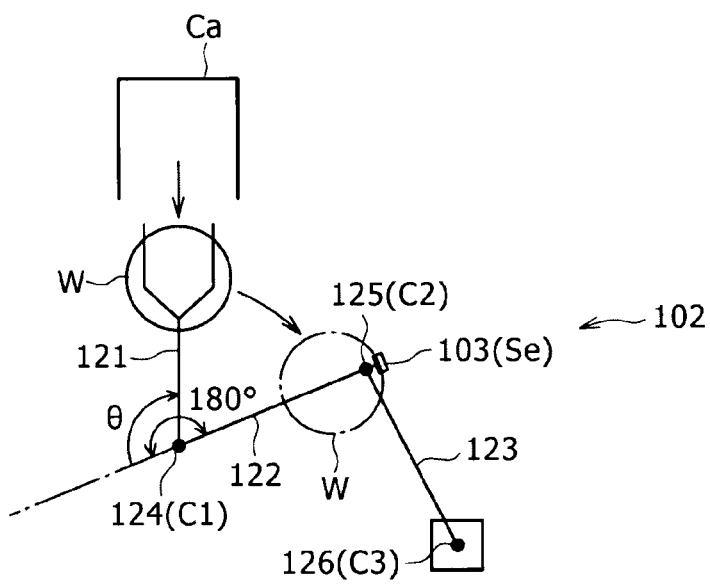

As seen in FIGS. 6A, 6B, 9A and 9B, the arm mechanism 102 particularly includes a first link 121 for holding a regular circular transport object article W on the distal end side thereof, a second link 122 connected at a distal end portion 122a thereof to a proximal end portion 121b of the first link 121 for pivotal motion in a horizontal plane, a third link 123 connected at a distal end portion 123a thereof to a proximal end portion 122b of the second link 122 for pivotal motion within a horizontal plane, and a base 120 for supporting a proximal end portion 123b of the third link 123 for pivotal motion in a horizontal plane. The first link 121 has a form of a plate having a substantially Y shape in plan and has an offset portion 121c formed on an upper face thereof. The offset portion 121c has a shape corresponding to a peripheral edge of the regular circular transport object article W. The offset portion 121c is a receiving face on which a regular circular transport object article W is to be placed and is formed lower at the inner periphery side thereof than at the outer periphery side thereof so as to exhibit a function of holding the transport object article W. The proximal end portion 121b of the first link 121 and the distal end portion 122a of the second link 122 are connected to each other for pivotal motion in a horizontal plane around an axis C1 of a rotational shaft extending along a perpendicular direction to the proximal end portion 121b and the distal end portion 122a to configure the first revolute joint section 124. Similarly, the proximal end portion 122b of the second link 122 and the distal end portion 123a of the third link 123, and the proximal end portion 123b of the third link 123 and the base 120, are connected for pivotal motion within horizontal planes around rotational axes C2 and C23 extending along a perpendicular direction to the proximal end portion 122b and the distal end portion 123a and to the proximal end portion 123b and the base 120 to configure the second revolute joint section 125 and the third revolute joint section 126, respectively. The revolute joint sections 124, 125 and 126 are configured to drive the links 121, 122 and 123 independently of each other by means of a power section M for which a motor or the like is used so that the angle θ between the links 121 and 122 can be changed as seen in FIGS. 9A and 9B. Also the angle between the links 122 and 123 and the angle of the link 123 around the base 120 can be changed by respective motors provided in the power section M.

The control section 104 is configured from a popular microcomputer unit including a CPU, a memory and an interface all not shown. Suitable programs for outputting control signals to the motors are stored in the memory, and the CPU suitably reads out and executes the programs to transport a regular circular transport object article W held by the first link 121 to an object position.

If, in such control, the center position of the regular circular transport object article W is displaced from a regular position on the first link 121 which is an end effecter, then such a situation occurs that, even if the distal end of the first link 121 is moved toward the object position along a required locus, the regular circular transport object article W is not transported to the object position.

Therefore, the arm type transport apparatus according to the present embodiment further includes, as means for detecting the center position of a regular circular transport object article W, the above-mentioned edge detection section 103 for detecting an edge of a regular circular transport object article W held by the first link 121, and a pivotal angle detection section 127 which may be formed from a rotary encoder for detecting the pivotal angle of the first link 121. The control section 104 of the arm type transport apparatus further includes, as the detecting means, a center position calculation section 141 for detecting the center position of the regular circular transport object article W based on detection values of the detection sections 103 and 127, and a decision section 142 for deciding a displacement of the center position of the regular circular transport object article W from a center position at which the center of the regular circular transport object article W should originally be positioned based on coordinates of the center position calculated by the center position calculation section 141.

Figure 6A:
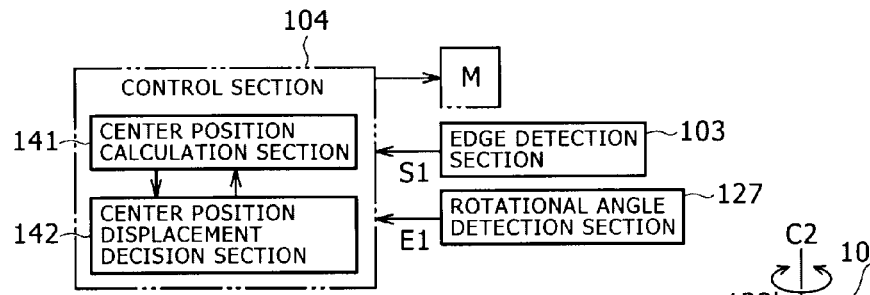
FIG. 6A is a block diagram showing a control section and associated sections of an arm type transport apparatus according to a second embodiment of the present invention.
Figure 7:
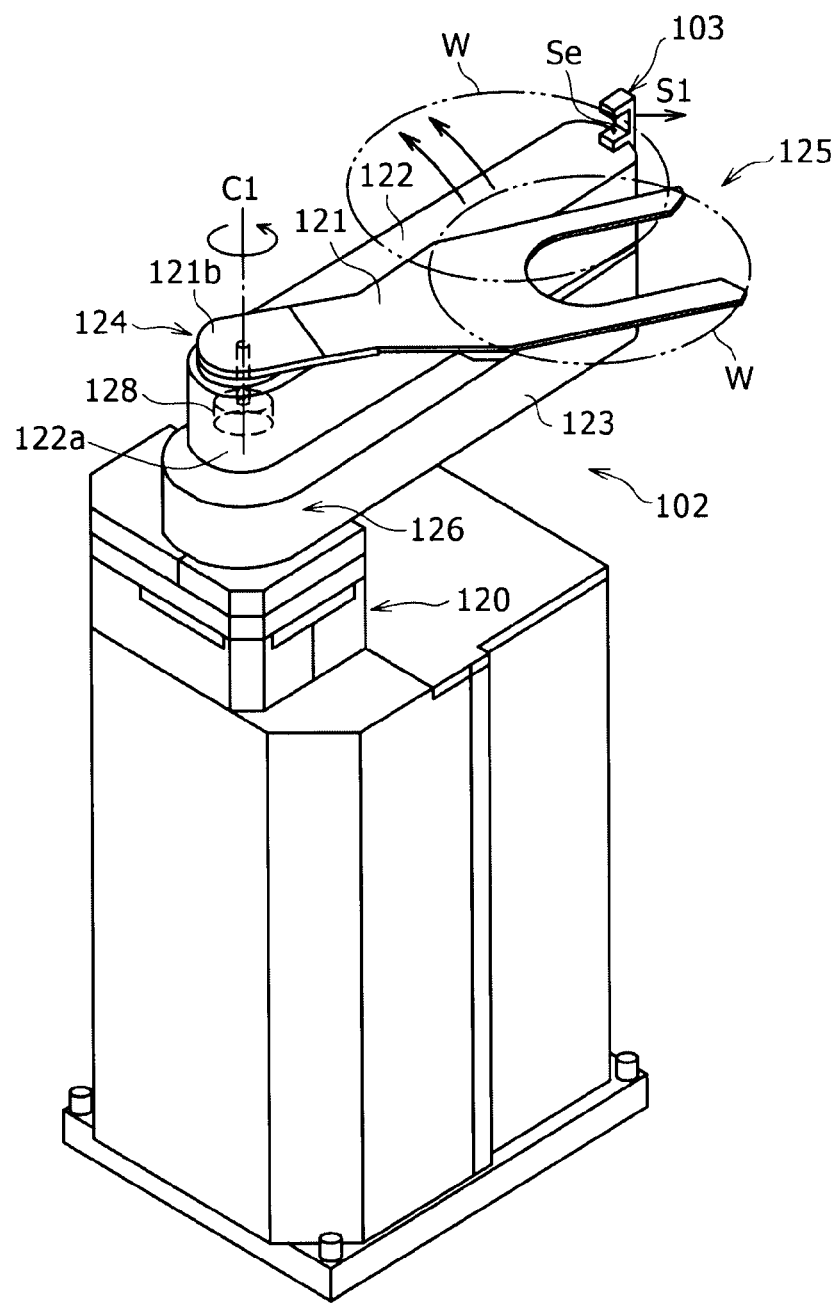
FIG. 7 is a perspective view illustrating a movement of the arm type transport apparatus of FIG. 6B.
Figure 8:
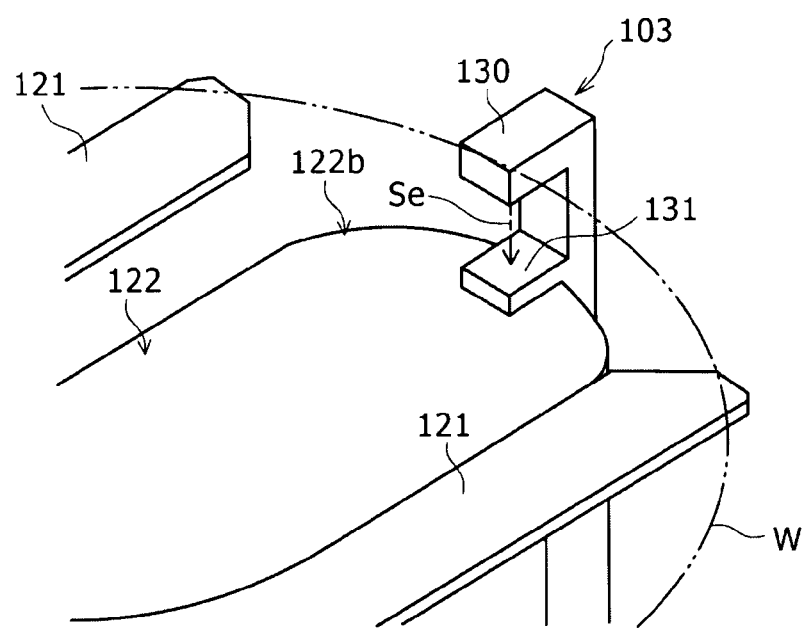
FIG. 8 is an enlarged perspective view showing an edge detection section of an arm of the arm type transport apparatus of FIG. 6B.

Referring to FIG. 8, the edge detection section 103 for detecting an edge of a regular circular transport object article W detects an edge of a regular circular transport object article W at a detection position Se corresponding to the attached position thereof like a photoelectric sensor formed from a light emitting element 130 and a light receiving element 131 or the like. In particular, the edge detection section 103 detects an edge of a regular circular transport object article W depending upon whether or not a light beam which advances from the edge detection section 103 toward the light receiving element 131 is intercepted by a regular circular transport object article W which passes the detection position Se on a path of light which interconnects the light emitting element 130 and the light receiving element 131. As seen in FIGS. 6B to 9B, the edge detection section 103 is attached at such a position at the proximal end portion 122b of the second link 122, which is positioned on the proximal end side with respect to the first link 121 from among the links 121, 122 and 123 which configure the arm mechanism 102, so that, when the first revolute joint section 124 is driven to rotate in a direction in which the first link 121 approaches the second link 122 to which the edge detection section 103 is attached, an edge of the regular circular transport object article W held regularly by the first link 121 can pass the detection position Se and be detected by the edge detection section 103. Thus, data when an edge of the regular circular transport object article W is detected is outputted as a signal S1 to the control section 104. Further, the attached position of the edge detection section 103 is set such that, when the revolute joint sections 124, 125 and 126 are driven to pivot, the edge detection section 103 does not interfere with the links 121, 122 and 123. In other words, it is considered that the edge detection section 103 is attached to a position keeping away from the loci of the pivotal motion of the links 121, 122 and 123.

Referring to FIG. 7, the pivotal angle detection section 127 is provided for a shaft motor 128 provided at the distal end portion 122a of the second link 122 which is provided on the proximal end side of the first link 121 for holding the regular circular transport object article W thereon in order to drive the first link 121 to pivot. The pivotal angle detection section 127 detects a pivotal angle of the first link 121 with respect to the second link 122 and outputs resulting data of the rotational angle as a signal E1 to the control section 104 as seen in FIG. 6A.

The center position calculation section 141 causes the regular circular transport object article W to pass the edge detection section 103 while pivoting the first link 121 with respect to the second link 122 to detect the center position of the regular circular transport object article W.

The center position calculation section 141 is configured from such an arithmetic operation program written in the memory of the control section 104 as described below, and the function as the center position calculation section 141 is exhibited by the arithmetic operation program executed by the control section 104.

This arithmetic operation includes an edge position storage step of reading in edge coordinates obtained by detecting an edge twice and a pivotal angle of the first link corresponding to the edge coordinates, and a center position calculation step of calculating center position coordinates of the regular circular transport object article W based on the read in information and storing the calculated center position coordinates into the control section 104.

First, the edge position storage step is described.

Figure 11A:
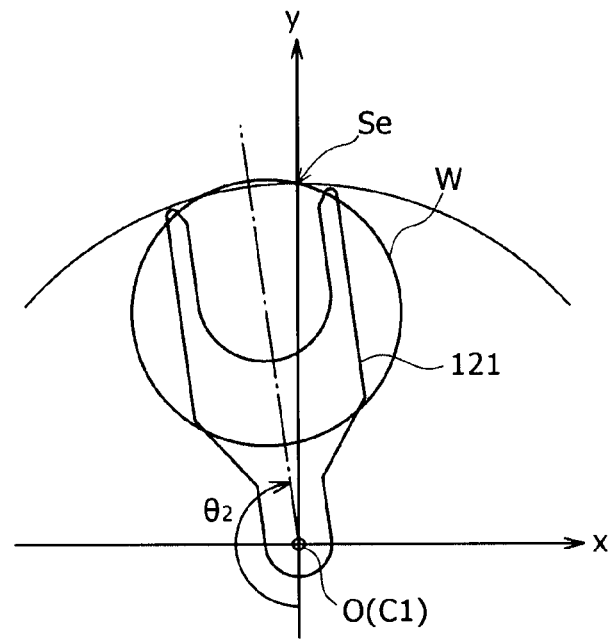
FIGS. 11A and 11B are schematic views illustrating a movement of a regular circular transport object article upon link pivotal motion of the arm type transport apparatus of FIG. 6B.
Figure 11B:
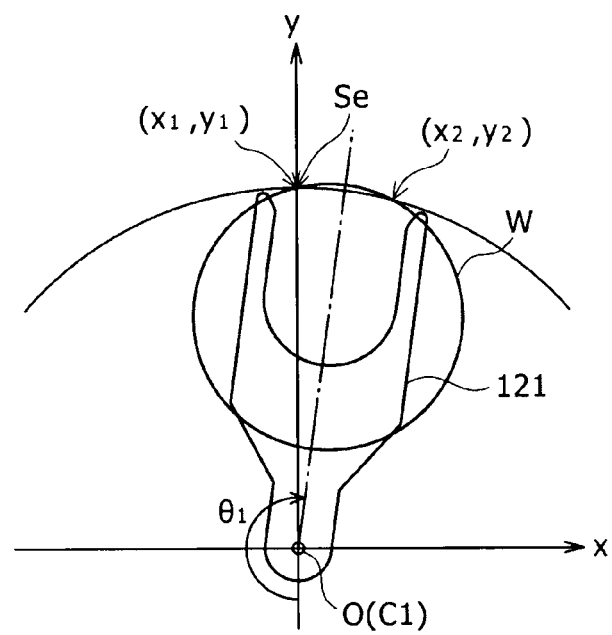

Referring to FIGS. 11A and 11B, it is assumed that the first link 121 which holds a regular circular transport object article W thereon pivotally moved in a clockwise direction, whereupon the regular circular transport object article W passes the edge detection section 103 from the left side to the right side around the rotational axis C1 and that the detection position Se of the edge detection section 103 is on the y axis.

FIG. 11A illustrates a state when the edge detection section 103 is placed into an on state, that is, when the edge detection section 103 begins to detect the regular circular transport object article W, and, while supplementary description is hereinafter given, the pivotal angle of the first link 121 at this time with respect to the second link 122 is represented by $\theta_2$.

FIG. 11B illustrates a state when the edge detection section 103 is placed into an off state, that is, when the edge detection section 103 ends the detection of the regular circular transport object article W. In FIG. 11B, a coordinate of a movement destination of an edge when the edge detection section 103 starts detection of the regular circular transport object article W is represented by $(x_2, y_2)$, and a coordinate of the edge when the edge detection section 103 ends the detection of the regular circular transport object article W is represented by $(x_1, y_1)$. The pivotal angle of the first link 121 at this time with respect to the second link 122 is indicated by $\theta_1$.

The supplementary description mentioned above is given here. Referring to FIG. 9B, the pivotal angle of the first link 121 with respect to the second link 122 signifies a pivotal angle when the first link 121 pivots in a clockwise direction around the revolute joint section 124 when the first and second links 121 and 122 are disposed in a straight line with the revolute joint section 124 inter posed therebetween is $\theta=0$.

However, the angle described above is an example of angle setting and is not limited to this, and the position of $\theta=0$ degree can be selected arbitrarily and also it is possible to set the counterclockwise direction as a positive direction of the pivotal angle.

The angles $\theta_1$ and $\theta_2$ illustrated in FIGS. 11B and 11A, respectively, are outputted as a signal E1 illustrated in FIG. 6A to the control section 104 from the pivotal angle detection section 127 provided for the shaft motor 128 provided at the distal end portion 122a of the second link 122.

The information outputted from the pivotal angle detection section 127 to the control section 104 is stored into the control section 104. The center position calculation section 141 collects the coordinates $(x_1, y_1)$ and $(x_2, y_2)$ obtained by detecting an edge twice and the corresponding pivotal angles $\theta_1$ and $\theta_2$ of the first link 121 with respect to the second link 122 and causes the control section 104 to execute a program which embodies the following algorithm for center position calculation stored in advance in the control section 104.

Figure 10:
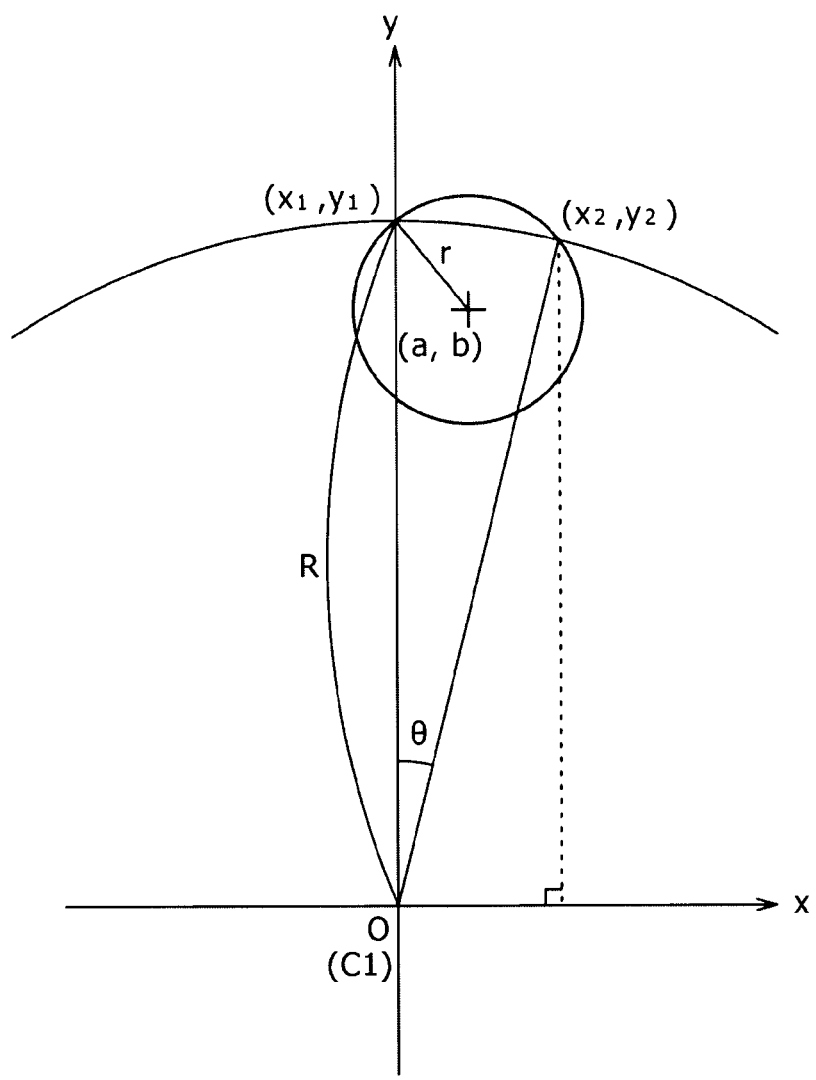
FIG. 10 is a diagrammatic view showing an x-y coordinate and illustrating a relationship between an edge and a center position of a regular circular transport object article after passing the edge detection section shown in FIG. 8.

FIG. 10 illustrates a position of the regular circular transport object article W when detection of an edge of the regular circular transport object article W for the second time ends, and in FIG. 10, the position is represented by an x-y coordinate. In particular, the coordinate $(x_1, y_1)$ is a coordinate upon ending of the edge detection and coincides with the detection position Se of the edge detection section 103. The coordinate $(x_2, y_2)$ is a coordinate of a destination of the movement of the point at which the edge is detected at the point of time, and the center position coordinate of the regular circular transport object article W is represented by (a, b).

Figure 6B:
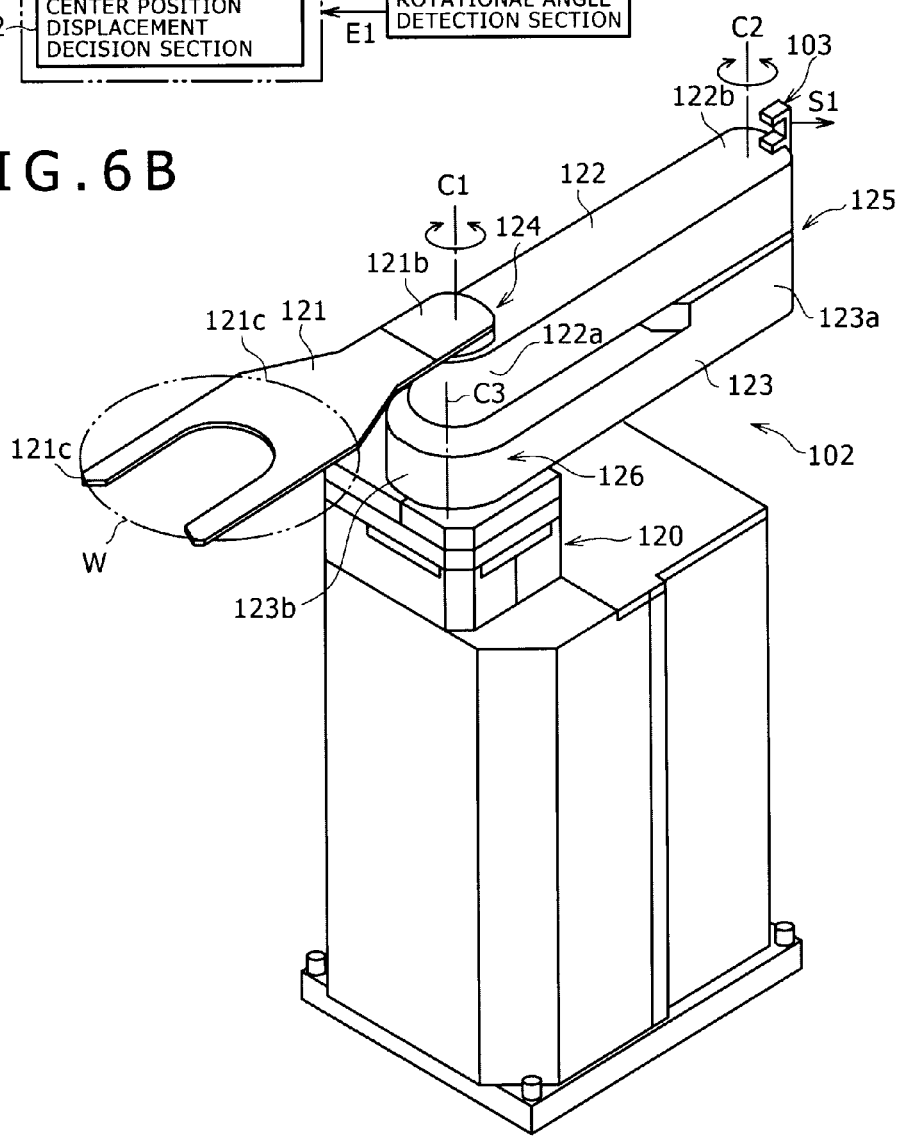
FIG. 6B is a perspective view showing the arm type transport apparatus.

The origin O here is the rotational axis C1 of the first link 121 shown in FIGS. 6B and 7, and the distance from the origin O of the first link 121 to the detection position Se is represented by R while the radius of the regular circular transport object article W is represented by r.

The rotational angle amount of the first link 121 with respect to the second link 122 during operation of the edge detection section 103 is represented by $$\theta=\theta_1-\theta_2$$

where $\theta_1$: rotational angle when the edge detection section 103 is placed into an off state, that is, when the edge detection section 103 ends to detect the regular circular transport object article W $\theta_2$: rotational angle when the edge detection section 103 is placed into an on state, that is, when the edge detection section 103 begins to detect the regular circular transport object article W Thus, the coordinate of the detected position of the regular circular transport object article W when the edge detection section 103 ends to detect the regular circular transport object article W, that is, when the edge detection section 103 is placed into an off state, is represented, where $$(x_1, y_1) = (0, R)$$

by $$(x_2, y_2) = (R\sin\theta, R\cos\theta)$$

The expression of the circle representing the regular circular transport object article W is, because $(x-a)^2+(y-b)^2=r^2$, by $$a = \frac{(y_1 - y_2)}{(x_2 - x_1)} b$$

Here, by substituting $$(x_1, y_1) = (0, R) \text{ and}$$

$$(x_2, y_2) = (R\sin\theta, R\cos\theta)$$

where α is $$\alpha = \frac{2}{1 + \cos\theta}$$

$$a = \frac{1 - \cos\theta}{\sin\theta} \times \frac{R \pm \sqrt{R^2 - \alpha(R^2 - r^2)}}{\alpha}$$

$$b = \frac{R \pm \sqrt{R^2 - \alpha(R^2 - r^2)}}{\alpha}$$

are obtained. Since θ, R and r have known values, the center coordinate (a, b) of the regular circular transport object article W when the edge detection section 103 ends to detect the regular circular transport object article W, that is, when the edge detection section 103 is placed into an off state, is calculated by the center position calculation section 141.

Since this center coordinate is the coordinate when the origin O is the pivotal axis of the first link 121 and the coordinate $(x_1, y_1)$ when the edge detection section 103 ends to detect the edge is represented by (0, R), the center position calculation section 141 actually uses the coordinate $(x_1, y_1)$ when the edge detection section 103 ends to detect the edge of the regular circular transport object article W from within the information obtained by detection of an edge twice as the reference to calculate the actual center position coordinate of the regular circular transport object article W at the point of time.

After the center position calculation section 141 executes the program which embodies the algorithm described above, the obtained center position coordinate is stored into the memory of the control section 104, thereby ending the center position calculation step.

Then, the decision section 142 executes a program embodying the following algorithm to decide positional displacement of the center position of the regular circular transport object article W from a center position at which the regular circular transport object article W should originally be positioned utilizing the center position calculation section 141.

In order to detect positional displacement, a reference point is decided first. In the present embodiment, the reference point is set to a position at which the center position of the regular circular transport object article W when the regular circular transport object article W is held regularly on the first link 121 without positional displacement is positioned on the center line of the first link 121 which extends in a leftwardly and rightwardly symmetrical relationship from the pivotal axis O or C1 of the first link 121 toward the distal end portion of the first link 121 (refer to FIGS. 6B, 9A, 9B, 11A and 11B) such that there is no trouble in transportation of the regular circular transport object article W to a transfer destination such as, for example, a FOUP (Front Opening Unified Pod).

The reference center position decided as the reference point is determined by calculation from installation conditions of the original robot and dimensions of associated portions of the robot, and the reference center position coordinate is set by teaching or the like.

Not the method just described but some other method may be used. For example, it is possible for the decision section 142 to cause the center position calculation section 141 to execute the center position calculation step described above with regard to the regular circular transport object article W placed regularly on the first link 121 without positional displacement to calculate the reference center position coordinate.

The reference center position coordinate calculated in this manner is stored into the memory of the control section 104 in advance such that the center position calculation section 141 executes the center position calculation step to calculate the actual center position of the regular circular transport object article W whose positional displacement is to be found.

Figure 12:
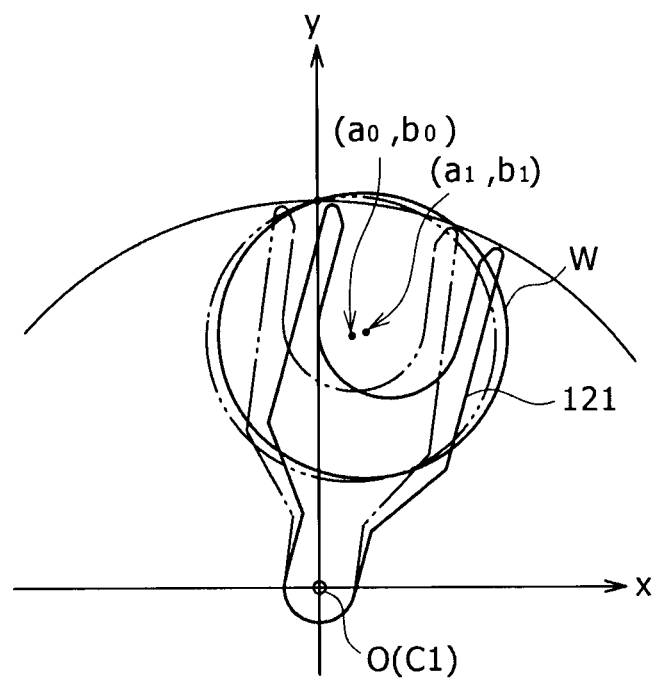
FIG. 12 is a schematic view illustrating a function for deciding center position displacement of a regular circular transport object article.

Then, if the actual center position coordinate of the regular circular transport object article W placed in a displaced state on the first link 121 is represented by $(a_1, b_1)$ and the reference center position coordinate is represented by $(a_0, b_0)$ as seen in FIG. 12, then the decision section 142 decides the difference between the coordinates, that is, $(\Delta x, \Delta y) = (a_1 - a_0, b_1 - b_0)$, as the center position displacement.

It is to be noted that, if the reference center position coordinate is stored in advance in the memory of the control section 104 together with identification data of the regular circular transport object article W, then only if the identification data is inputted or selected, then it is necessary only to calculate the actual reference position.

As described above, the arm type carrying apparatus according to the present embodiment includes an arm mechanism 102 including a first link 121 attached to a second link 122, which serves as a base member, for holding a regular circular transport object article W for pivotal motion in a horizontal plane through a rotational shaft C1, an edge detection section 103 attached to the second link 122 together with the rotational shaft C1 and adapted to detect that an edge of the regular circular transport object article W is positioned at a detection position Se determined with respect to the attached position thereof, a pivotal angle detection section 127 adapted to detect a pivotal angle θ of the link 121 with respect to the second link 122, and a center position calculation section 141 adapted to calculate a center position of the regular circular transport object article W with respect to the link 121 based on the corresponding pivotal angle θ detected by the pivotal angle detection section 127 when the edge of the regular circular transport object article W passes the edge detection section 103. Therefore, only if the first link 121 which holds a regular circular transport object article W thereon is moved to pass the edge detection section 103 of the second link 122 serving as the base member, the center position coordinate of the regular circular transport object article W can be calculated by the pivotal angle detection section 127 and the center position calculation section 141. Consequently, the necessity to transport regular circular transport object articles W one by one to an aligner or the like provided separately from the arm type transport apparatus and position the regular circular transport object article W. Therefore, the time required for transportation and alignment can be reduced significantly, and also the cost can be reduced significantly.

The arm type carrying apparatus further includes a center position displacement decision section 142 adapted to detect positional displacement of the regular circular transport object article W based on the center position calculated by the center position calculation section 141, the center position displacement decision section 142 deciding center position displacement from a reference center position {coordinate $(a_0, b_0)$} applied in advance to an actual center position {coordinate $(a_1, b_1)$} when the calculation by the center position calculation section 141 is carried out with regard to the regular circular transport object article W placed on the first link 121 to be measured based on the reference center position and the actual center position. Therefore, positional displacement of the center position of the regular circular transport object article W can be decided while the regular circular transport object article W is left placed on the first link 121, and if the regular circular transport object article W does not require positional correction in a rotational axis direction by the aligner, then it can be transported to a transport object article transport destination such as a FOUP while the positional displacement of the regular circular transport object article W with respect to the first link 121 is corrected in accordance with an instruction from the control section 104. Therefore, the time required for transportation and alignment can be reduced significantly, and also the cost can be reduced significantly.

On the other hand, if the regular circular transport object article W requires correction in a rotational axis direction by the aligner, then it may be transported to and positioned with respect to the aligner in order to detect only displacement in the one direction. Therefore, the operation time can be reduced in comparison with an alternative case wherein alignment is carried out with regard to all of the X axis, Y axis and rotational axis directions.

Further, if the reference center position coordinate adopted once is thereafter stored into the memory of the control section 104 together with the identification data and then a transport article of a different type is transmitted and thereafter the regular circular transport object article W same as that described above is transported, then only it is necessary to read the reference center position coordinate stored in the memory into the control section 104 even if an edge is not detected and the center position coordinate is not calculated. Therefore, a higher transport processing efficiency can be achieved simply and readily.

Although the arm type transport apparatus according to the second embodiment of the present invention is described above, it can be modified in various manners.

For example, while, in the present embodiment, the edge detection section 103 is attached to the second link 122, the link to which the edge detection section 103 is attached is not limited to the second link 122, but the edge detection section 103 may be applied to any link only if the link is provided on the proximal end side with respect to the first link 121 and may be applied, for example, to the third link 123. While the arm mechanism in the present embodiment is configured from the three links 121 to 123 connected to each other for pivotal motion in horizontal planes, it may otherwise be configured from two or four or more links connected to each other similarly.

Further, while a photo-sensor of the transmission type is used as the sensor in the present embodiment, a photo-sensor of the reflection type may be used instead. A reflection type photo-sensor can be incorporated not at an arm end but in the inside of the arm.

Further, while the trajectory correction described above is applied to a transport apparatus which includes an arm mechanism configured from a plurality of links connected in series for pivotal motion relative to each other, it can be applied also to a transport apparatus which includes an arm mechanism of any other type. For example, it is possible to apply the trajectory correction also to a transport apparatus such as a parallel manipulator configured from a plurality of links connected in parallel to each other.

Further, while the arm type transport apparatus of the present embodiment is configured such that a regular circular transport object article such as a wafer is held by the first link or end effecter by placing the regular circular transport object article on the first link or end effecter, it may otherwise be configured such that a regular circular transport object article is held by vacuum attraction or mechanical chucking.

While preferred embodiments of the present invention have been described using specific terms, such description is for illustrative purpose only, and it is to be understood that changes and variations may be made without departing from the spirit or scope of the following claims.

IN THE DRAWINGS

1: control section
2: decision section
3: where transport object article is at predetermined position
4: where transport object article is positionally displaced from predetermined position
5: center position calculation section
6: center position displacement decision section
7: edge detection section
8: rotational angle detection section

What is claimed is:
1. A robot arm apparatus, comprising:
an arm mechanism including plural links pivotally connected for pivotal motion in a horizontal plane, the plural links including a first link configured to hold a transport object at a distal end thereof;
a sensor, provided on a second link whose distal end is connected to a proximal end of the first link, and configured to detect the transport object held by the first link;
a driver configured to pivotally rotate the plural links to transport the transport object held by the first link, the driver pivotally rotating the first link with respect to the sensor; and
a decision section configured to measure, when the driver pivotally rotates the first link with respect to the sensor at a predetermined speed, time required for the sensor to detect a first edge of the transport object after detecting a second edge of the transport object, the decision section being further configured to decide whether or not the transport object is correctly held at the right holding position by the first link in accordance with the measured time,
wherein the sensor is provided at a position on the second link at which the sensor can detect the transport object, which is correctly held at a right holding position on the first link, when the driver pivotally rotates the first link with respect to the sensor.
2. The robot arm apparatus according to claim 1, further comprising:

a controller configured to control the driver to pivotally rotate the plural links, the controller generating a first error signal if the sensor does not detect the transport object when the first link and the sensor are positioned for the sensor to detect the transport object held by the first link.

3. The robot arm apparatus according to claim 2, wherein the controller generates a second error signal if the decision section decides that the transport object is not correctly held at the right holding position on the first link.

4. The robot arm apparatus according to claim 1, wherein the sensor includes a light emitting element and a light receiving element, the sensor detecting the transport object when the transport object passes between the light emitting element and the light receiving element.

5. The robot arm apparatus according to claim 1, wherein the transport object is a flat, circular shaped object.

6. The robot arm apparatus according to claim 5, wherein the first link has an offset portion to hold the transport object.

7. A robot arm apparatus, comprising:
an arm mechanism including a base member and a link pivotally connected to the base member for pivotal motion in a horizontal plane through a rotational shaft, the link being configured to hold a regular circular transport object at a distal end thereof;
an edge detector which detects first and second edges of the regular circular transport object at a detection position by a sensor;
a pivotal angle detector which detects a pivotal angle of the link with respect to the base member after the first edge of the regular circular transport object passes the detection position until the second edge of the regular circular transport passes the detection position; and
a center position calculator which calculates a center position of the regular circular transport object based on the detected pivotal angle of the link, a distance (R) from a given origin (O) of the link to the detection position of the first and second edges of the regular circular transport object and a radius (r) of the regular circular transport object.

8. The robot arm apparatus according to claim 7, further comprising:
a decision section configured to detect displacement of the regular circular transport object held on the link, based on comparison between the center position calculated by the center position calculator and a reference center position of the regular circular transport object article correctly placed at a right position on the link.

9. The robot arm apparatus according to claim 8, further comprising:
a driver configured to pivotally rotate the link with respect to the base member to transport the transport object held on the link, the driver pivotally rotating the link with respect to the edge detector.

10. The robot arm apparatus according to claim 9, further comprising:
a controller configured to control the driver to pivotally rotate the link with respect to the base member, the controller generating an error signal if the decision section detects the displacement of the regular circular transport on the link.

11. The robot arm apparatus according to claim 8, further comprising:
a memory configured to store data of the reference center position.

* * * * *